United States Patent
Angel et al.

(10) Patent No.: US 7,180,383 B2
(45) Date of Patent: Feb. 20, 2007

(54) ARRANGEMENT WITH A CAPACITOR WHICH CAN BE CONNECTED INTO A CIRCUIT AND DISCONNECTED THEREFROM AND ASSOCIATED METHOD

(75) Inventors: Jörn Angel, Bochum (DE); Jürgen Oehm, Ratingen (DE)

(73) Assignee: Infineon Technologies AG, Munich (DE)

( * ) Notice: Subject to any disclaimer, the term of this patent is extended or adjusted under 35 U.S.C. 154(b) by 66 days.

(21) Appl. No.: 11/051,221

(22) Filed: Feb. 4, 2005

(65) Prior Publication Data

US 2005/0190022 A1    Sep. 1, 2005

(30) Foreign Application Priority Data

Feb. 4, 2004    (DE) .................... 10 2004 005 547

(51) Int. Cl.
*H03B 5/18* (2006.01)
(52) U.S. Cl. ................. 331/177 V; 331/36 C; 327/581
(58) Field of Classification Search .......... 331/177 V, 331/36 C; 327/581
See application file for complete search history.

(56) References Cited

U.S. PATENT DOCUMENTS

| | | | | |
|---|---|---|---|---|
| 5,926,064 A | * | 7/1999 | Hariton | ............ 327/581 |
| 6,995,626 B2 | * | 2/2006 | Oehm et al. | ............ 331/177 V |
| 7,019,598 B2 | * | 3/2006 | Duncan et al. | ............ 331/176 |
| 7,061,340 B2 | * | 6/2006 | Boccuzzi et al. | ....... 331/177 V |
| 7,109,812 B2 | * | 9/2006 | Brauchler | ............ 331/117 FE |
| 2001/0050598 A1 | | 12/2001 | Mourant et al. | |
| 2003/0141936 A1 | * | 7/2003 | Staszewski et al. | ........... 331/16 |
| 2003/0189466 A1 | | 10/2003 | Kitamura | |

OTHER PUBLICATIONS

"A First Digitally-Controlled Oscillator in a Deep-Submicron CMOS Process for Multi-GHz Wireless Applications", Robert B. Staszewski, Dirk Leipold, Chih-Ming Hung and Poras T. Balsara, IEEE Radio Frequency Integrated Circuits Symposium, Jun. 2003, pp. 81-84.

* cited by examiner

*Primary Examiner*—Robert Pascal
*Assistant Examiner*—Levi Gannon
(74) *Attorney, Agent, or Firm*—Eschweiler & Associates, LLC

(57) ABSTRACT

An arrangement and a method for connecting a capacitor into a circuit and disconnecting it therefrom are disclosed. The capacitor includes two capacitor elements, each with a main terminal and an auxiliary terminal. The auxiliary terminals are connected to one another at a reference node to which a control signal can be coupled as a function of the desired capacitance value. The capacitance value is tapped at the main terminals of the capacitor elements. When the capacitor is switched on, a high quality level is obtained, and when the capacitor is switched off, low parasitic capacitance components are obtained. For this reason the described arrangement is particularly suitable for use in voltage-controlled oscillators.

14 Claims, 2 Drawing Sheets

ARRANGEMENT WITH A CAPACITOR WHICH CAN BE CONNECTED INTO A CIRCUIT AND DISCONNECTED THEREFROM AND ASSOCIATED METHOD

REFERENCE TO RELATED APPLICATIONS

This application claims the benefit of the priority date of German application DE 10 2004 005 547.5, filed on Feb. 4, 2004, the contents of which are herein incorporated by reference in their entirety.

FIELD OF THE INVENTION

The present invention relates to an arrangement with a capacitor which can be connected into a circuit and disconnected therefrom, the use of the arrangement in an oscillator and an associated method.

BACKGROUND OF THE INVENTION

Tuneable oscillatory circuits are usually constructed as LC oscillators in integrated circuit technology. In this context, inductors and capacitors are the frequency-determining components. A controllable capacitor can easily be used to tune the frequency with integrated circuit technology. Such controllable capacitors are implemented, for example, using varactor diodes whose depletion layer capacitance varies with the cut-off voltage. In order to be able to switch the frequency in discrete steps or provide a means of switching over the band of a tuneable oscillator, it is advantageous to introduce not only capacitors which can be tuned in an analog fashion into the LC oscillatory circuit but also capacitors which are embodied so as to be capable of being connected into the circuit and disconnected therefrom.

In the case of VCO capacitors which can be connected into the circuit and disconnected from it in a digital fashion it is normally desirable for the capacitor to have a very high quality level when it is connected into the circuit, but for the parasitic capacitance components to remain small when it is disconnected from the circuit. In addition there is the requirement for parasitic interference influences in the supply voltage to have no influence, or the smallest possible influence, on the capacitance. When a switchable capacitance is used in an oscillator it is also desirable to be able to cover the largest possible frequency range.

FIG. 2 shows by way of example the circuit design of a symmetrically embodied LC oscillator. The oscillator is embodied as a voltage-controlled oscillator VCO. In the VCO shown, an inductor 1, 2 is provided which is connected between two circuit nodes A, B of the VCO and has a center tap. The center tap of the inductor 1, 2 with the inductance value L is connected to a supply potential terminal 4 via a power source 3. Furthermore, a variable capacitor C, which can be adjusted both in an analog fashion and also in discrete steps, is connected between the circuit nodes A, B. The oscillation frequency $f_{OSZ}$ of the oscillator is calculated in a good approximation by the resonance frequency of the LC circuit according to the rule $$f_{OSZ} = \frac{1}{2\pi\sqrt{L \cdot C}}$$

where L designates the overall inductance value and C the overall capacitance value in the oscillatory circuit.

In order to tune in an analogous fashion, an analog tuning signal in the form of a tuning voltage can be fed to an input 6. Furthermore, a digital frequency word of the word length n can be fed to a further control input 7 in order to preselect the frequency range. This defines how many capacitors, acting in parallel as fixed-value capacitors, are connected to the oscillatory circuit.

An oscillation compensation amplifier which comprises two cross-coupled MOS transistors 8, 9 is connected between the circuit nodes A, B. The cross-coupled transistors 8, 9 are connected to reference potential 10. The oscillatory circuit frequency is determined by the inductance value L and the capacitance value C. The amplifier 8, 9 provides a negative impedance which compensates the attenuation of the oscillatory circuit. The output signal with the desired frequency can be tapped at the circuit nodes A, B in differential form. At said nodes, two signals which are phase-shifted by 180 degrees and which oscillate with the frequency $f_{OSZ}$ are made available.

As already explained, the analog change in capacitance is preferably implemented with integrated varactor diodes. In contrast, the frequency tuning in discrete steps can be carried out by means of series switches, as shown in FIGS. 3a to 3c.

For example, FIG. 3a shows a digitally switchable capacitor 11 which is connected by means of, in each case, one series switch 12, 13 between the circuit nodes A, B in FIG. 2. By simultaneously opening and closing the switches 12, 13, the capacitor 11 either makes a contribution to the determination of the frequency of the oscillatory circuit, or does not.

A different possible way of arranging the series switches is shown by FIG. 3b. In said figure, two capacitors 14, 15 are provided and these each have twice the capacitance value of the capacitor 11 in order to bring about the same change in frequency. The capacitors 14, 15 are each connected by one terminal to the reference potential terminal 10, and by a further terminal to, in each case, one of the switching nodes A, B via, in each case, one series switch 16, 17.

FIG. 3c shows a modification of the circuit from FIG. 3b in which the capacitors 14, 15 and the series switches 16, 17 are interchanged.

All three prior art solutions according to FIGS. 3a to 3c have in common the fact that one or more electronic switches are connected into the circuit in series with a capacitor. This makes it possible to connect a capacitance value into the circuit between the terminals A and B of the VCO and, in turn, to disconnect it from the circuit.

The electronic switches are generally embodied as metal oxide semiconductor transistors which are operated in a switching fashion. For the series resistance of these transistors to remain low for high quality levels of the capacitor which can be connected into the circuit, the transistors must be configured with a correspondingly large channel width. When the transistors are embodied using integrated circuit technology, they then have a considerable chip area requirement. However, the parasitic capacitances which are unavoidably present when such a transistor is integrated also reach considerable values as the size of the switch increases. A further disadvantage of the parasitic capacitances is the reduction in the achievable capacitance ratio between the switched-on capacitor and the switched-off capacitor. However, the achievable change in frequency, and thus the digital tuning range for a VCO which can be provided is thus also small.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to an arrangement with a capacitor which can be connected into a circuit and disconnected therefrom, and a method for connecting a capacitor into a circuit and disconnecting it therefrom. In the arrangement and method, the capacitor has a high quality level when it is connected into the circuit and yet has low parasitic capacitances when it is disconnected from the circuit.

The arrangement comprises a first capacitor element provided with a main terminal and an auxiliary terminal, and a second capacitor element provided with a main terminal and an auxiliary terminal. The first and second capacitor elements each have one control electrode which is connected to the respective main terminal, and each have a channel with a controllable conductivity, which is connected to the auxiliary terminal, wherein the auxiliary terminals of the first and second capacitor elements are connected to one another at a reference node. The main terminal of the first capacitor element and the main terminal of the second capacitor element form a symmetrical terminal of the capacitor. In addition, a control input is provided and coupled to the reference node in order to connect the capacitor into the circuit and disconnect it therefrom.

The present invention further comprises a method for connecting a capacitor into a circuit and disconnecting it therefrom. The method comprises providing a first and a second capacitor element, each having a channel whose conductivity can be controlled by means of a potential difference between a main terminal and auxiliary terminals thereof. The method further comprises applying a control signal to the two controllable channels, and tapping the capacitance between the two main terminals which occurs as a function of the control signal.

The first and second capacitor elements are preferably each embodied as a unipolar transistor. The gate terminals preferably form the main terminals here. The source and drain terminals of the transistors are preferably connected to one another and to the reference node. Such an arrangement is particularly suitable for monolithic integration.

It is also possible to use metal insulator semiconductor transistors or other field-effect transistors for implementing the first and second capacitor elements.

Instead of the transistors it is also possible to use capacitor diodes.

The transistors are preferably n-channel metal oxide semiconductors (MOS). Preferably normally-off transistors are used here.

However it is also alternatively possible to use p-channel MOS transistors or bipolar transistors.

In order to couple the control input to the reference node, an inverter which inverts the control signal before it is applied to the two controllable channels is preferably provided. As a result it is possible with a low degree of expenditure to apply the reference node either to the reference potential or to the supply potential depending on the level of the controlled signal.

A driver transistor which is connected with its controlled path between the reference node and a reference potential terminal is preferably provided. The control terminal of the driver transistor is advantageously connected to the control input of the arrangement here. As a result, the potential at the reference node is additionally statically supported. As a result, when the capacitor is used in an oscillator, the VCO phase noise is reduced further.

The potential at the reference node and thus the potential at the controllable channels is preferably stabilized in a capacitive fashion. For this purpose, a capacitor is advantageously connected between the reference node and the reference potential terminal of the arrangement. As a result, the reference node is dynamically held at a low impedance, irrespective of its potential. This is particularly significant at the high frequencies occurring in the VCO operating mode.

The inverter preferably has a supply terminal which is connected to a reference potential by means of a backup capacitor. As a result the potential at the supply terminal of the inverter is backed up capacitively. Consequently, noise or interference from the supply potential occurring in the inverter and further circuit components is suppressed further.

A supply terminal is advantageously recharged from the supply voltage of the arrangement via a diode. For this purpose, a diode is preferably connected between a supply potential terminal of the arrangement and the supply terminal of the inverter.

The diode is preferably embodied as an n-channel MOS transistor. Said diode has a low voltage drop and at the same time a very high differential resistance. As a result, a low-pass filter is advantageously obtained from the supply potential terminal to the supply terminal of the inverter in conjunction with the backup capacitance at the supply terminal of the inverter. This low-pass filter has a particularly low cut-off frequency. As a result optimum blocking of noise and interference on the supply voltage is brought about.

A switch is preferably connected with its controlled path in parallel with the diode in order to quickly charge the backup capacitor. This enables the backup capacitor to be precharged quickly, for example in the event of a switch-on process of the arrangement. If the supply terminal of the inverter has reached an approximately positive supply potential, the switch is opened again.

According to the present invention, the capacitor has a particularly high quality level when it is connected into the circuit and also low parasitic capacitance components when it is disconnected from the circuit. In addition, according to the invention it is advantageously possible, at low cost, to largely suppress parasitic interference from the supply voltage. The described arrangement is preferably used for application in oscillators owing to its properties and the large quotient of the maximum capacitance to the minimum capacitance. In particular, the arrangement is suitable for application in LC oscillators and/or tuneable oscillators.

It is advantageously possible here not only to provide a single, described capacitor which can be connected into the circuit and disconnected from it, but it is also possible, depending on the requirement, to provide capacitance fields. These capacitance fields may be stepped in a binary fashion or have identical capacitance values. As a result, on the one hand, frequency band switching over for multiband radio devices can be brought about. On the other hand, it is however also advantageously possible to easily perform digital modulation by switching the capacitors.

It is of course additionally possible to provide one or more capacitors which can be tuned in an analog fashion and combined with the proposed capacitor or capacitors, which can be connected into a circuit and disconnected from it, in an oscillator.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in more detail below by means of an exemplary embodiment and with reference to the figures, of which.

DETAILED DESCRIPTION OF THE INVENTION

Figure 1:
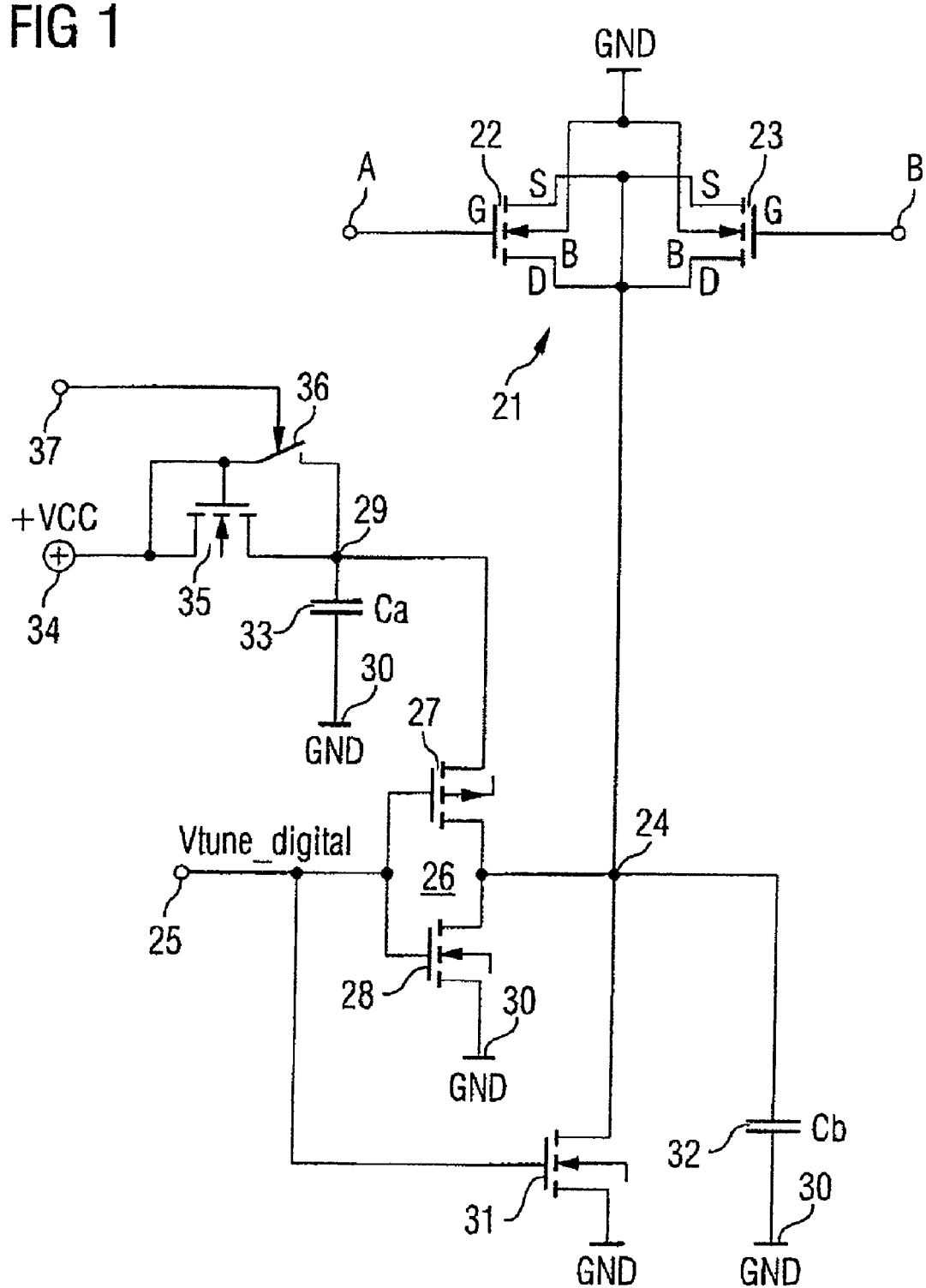
FIG. 1 is a schematic diagram illustrating an exemplary embodiment of a circuit arrangement according to the present invention.

FIG. 1 shows an arrangement with a capacitor 21 which can be connected into a circuit and disconnected from it and which comprises a first component capacitor 22 and a second component capacitor 23. Each component capacitor 22, 23 has a main terminal A, B and an auxiliary terminal. The main terminal A, B is connected in each case to a control electrode G. The auxiliary terminal is connected to a controllable channel S, D. The conductivity of the channel depends on the difference in potential between the main terminal and auxiliary terminal. The auxiliary terminals of the two capacitor elements 22, 23 are connected to one another and to a reference node 24. The main terminals A, B of the first and second component capacitors 22, 23 form a symmetrical terminal of the capacitor 21.

A control signal for connecting and disconnecting the capacitor into and out of a circuit is fed to a control input 25. The control input 25 is coupled to the reference node 24 via an inverter 26. The inverter 26 comprises two complementary transistors 27, 28 whose control terminals are connected to the control input 25 and whose controlled paths are connected to one another in a series circuit. The series circuit of the controlled paths of the transistors 27, 28 is connected between a supply terminal 29 of the inverter and a reference potential terminal 30 of the circuit.

Furthermore, the reference node 24 is connected to reference potential 30 via the controlled path of a driver transistor 31 and a capacitor 32 which is connected in parallel therewith. The control input of the driver transistor 31 is connected to the control input 25 of the arrangement.

The supply terminal 29 of the inverter 26 is connected to reference potential terminal 30 via a backup capacitor 33. A MOS diode 35 is connected in the forward direction between a supply potential terminal 34 of the arrangement and the supply terminal 29. A switch 36, which is connected to a control input 37, is arranged in parallel with the MOS diode 35.

The first and second component capacitors 22, 23 are each embodied as unipolar, normally-off MOS field-effect transistors of the n-channel type.

A voltage which is present at the reference node 24 has either a reference potential GND or a maximum positive potential close to +VCC, that is to say the positive supply voltage, with respect to the reference potential GND. If the reference node 24 assumes the reference potential GND in a first switched state, the capacitance between the nodes A and B is at a maximum. The capacitance is then connected into the circuit. In contrast, if the reference node assumes virtually the supply potential VCC, the capacitance between the nodes A and B is at a minimum. The capacitance is thus switched off.

If reference potential GND is present at the reference node 24, a low-impedance channel is established under the gate oxide of the n-MOS transistors 22, 23. The capacitance value between the terminals A, B is then calculated from the series connection of the capacitance per unit length of the MOS transistors 22, 23.

Given a high potential at the reference node 24 with respect to the reference potential GND, the channel disappears virtually completely under the gate oxide of the transistors 22, 23. The capacitance value between the terminals A and B then becomes virtually zero.

The potential at the reference node 24 is impressed statically by the inverter 26. An additional static backup is brought about by the driver transistor 31. The reference node 24 is also dynamically held at particularly low-impedance values for high frequencies by means of the capacitor 32, irrespective of the potential of said reference node 24.

Figure 2:
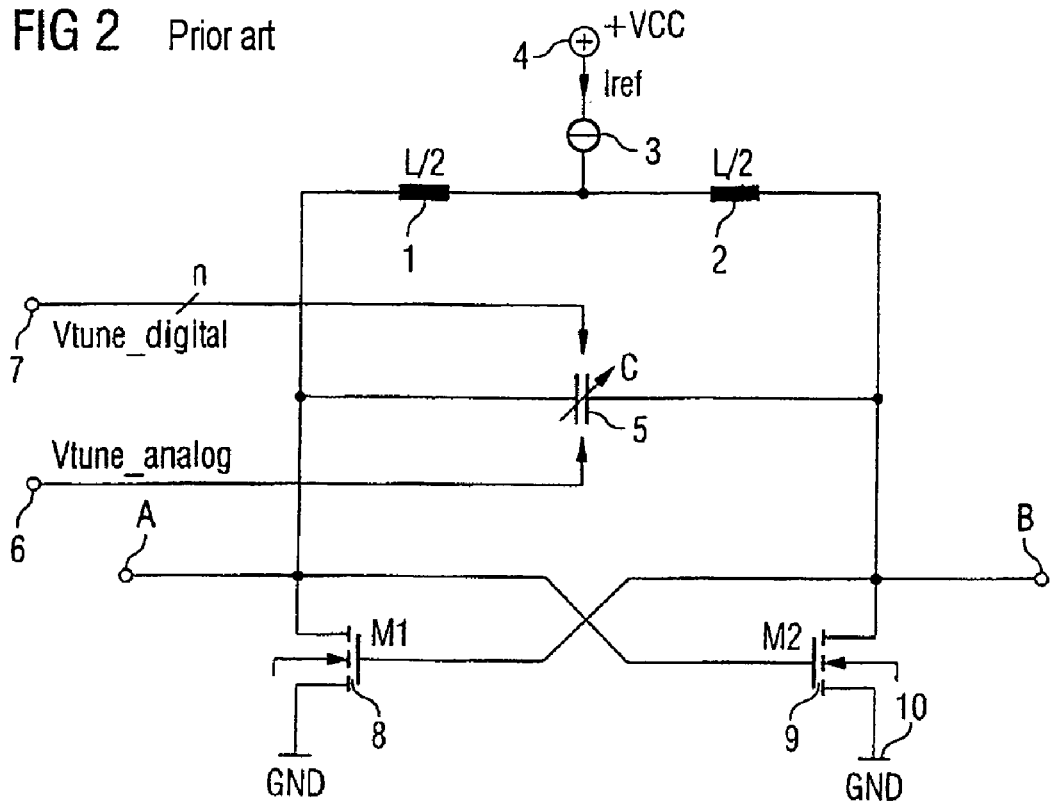
FIG. 2 is a schematic diagram illustrating an LC oscillator in which the circuit from FIG. 1 can advantageously be applied.
Figure 3A:
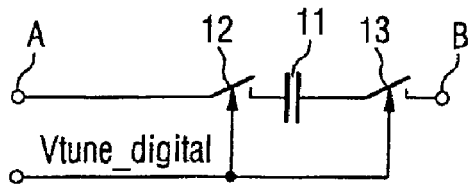
FIGS. 3a to 3c are schematic diagram illustrating capacitors according to the prior art which can be connected into the circuit and disconnected from it using series switches.
Figure 3B:
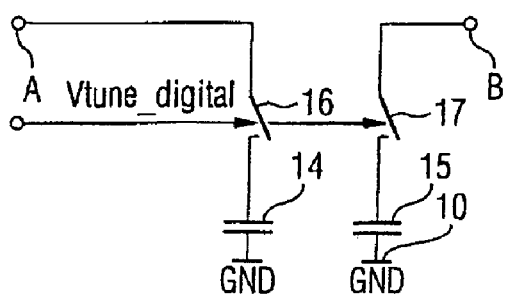
Figure 3C:
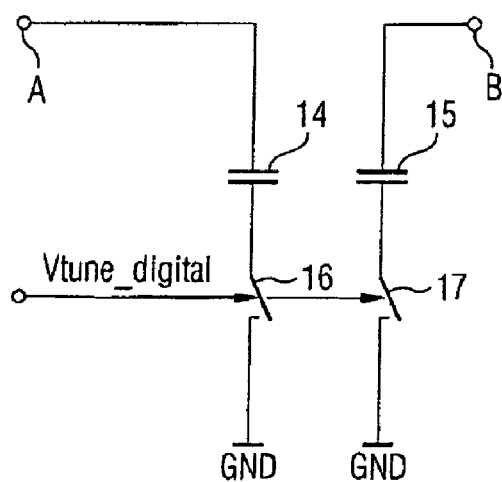

If the reference node 24 has reference potential GND, connecting it to the reference potential with the lowest possible impedance is advantageous with respect to a further reduction in the VCO phase noise if the circuit in FIG. 1 is used in a VCO oscillator according to FIG. 2 or other oscillatory circuits.

If, in fact, for example the node A is at the amplitude minimum, the channel of the transistor 22 has briefly disappeared at large oscillator amplitudes. However, the impedance of the channel of the transistor is at a minimum. Connecting the reference node 24 to reference potential GND with the lowest possible impedance is particularly advantageous for ensuring that no noise can influence the VCO oscillation at this moment.

If the reference node 24 conducts a positive potential near to the supply potential +VCC, it is also particularly advantageous in this state if no noise or interference is fed into the reference node 24. Noise or interference could influence the VCO oscillation. For this reason, the reference node 29 is additionally advantageously backed up by the capacitor 33. The capacitor 33 is quickly precharged by means of the electronic switch 36 if a signal which closes the switch 36 is present at the input 37. If the supply terminal 29 has approximately reached VCC potential, the switch 36 is opened again. The node 29 is then held at positive VCC potential via the diode 35, which is embodied as an n-MOS diode. Since the diode 35 has a very high differential resistance when there is a small drop in voltage, a low-pass filter is advantageously obtained from the supply potential terminal 34 to the supply terminal 29 in conjunction with the capacitor 33. The low-pass filter has a very low cut-off frequency. This provides particularly good blocking of noise or interference.

Overall there is a particularly high quality of the capacitor 21 when it is switched on. When it is switched off the capacitor has particularly low parasitic components. In addition, it is ensured that parasitic interference from the supply voltage VCC is capable of having a particularly small influence on the capacitor 21 itself or on the entire capacitance in an oscillator. In addition, owing to the large quotient of the capacitor which is connected into the circuit with respect to the capacitor which is disconnected from the circuit when it is used in a VCO a particularly large frequency ratio is obtained. For this reason, the circuit in FIG. 1 can also be used particularly advantageously in an LC oscillator according to FIG. 2.

The circuits according to FIGS. 2 and 3a to 3c have already been described at the beginning.

The exemplary embodiment described according to FIG. 1 can generally also be implemented using complementary circuit technology. For example, power sources may be embodied either with n-MOS transistors or with p-MOS transistors. The circuit can also be constructed using bipolar circuit technology.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A capacitor arrangement that is operable to be connected to and disconnected from a circuit, comprising:
   a first capacitor element having a main terminal and an auxiliary terminal;
   a second capacitor element having a main terminal and an auxiliary terminal;
   wherein the first and second capacitor elements each have one control electrode connected to its respective main terminal, and each have a channel with a controllable conductivity connected to the auxiliary terminal;
   wherein the auxiliary terminals of the first and second capacitor elements are connected to one another at a reference node;
   wherein the main terminal of the first capacitor element and the main terminal of the second capacitor element form terminals of the capacitor;
   wherein a control input is coupled to the reference node, and based upon a state thereof is operable to alter a capacitance of the capacitor, thereby selectively connecting or disconnecting the capacitor to or from the circuit, respectively;
   an inverter configured to couple the control input to the reference node; and
   a driver transistor having a controlled path and configured to selectively connect the reference node to a reference potential terminal, the driver transistor comprising a control terminal connected to the control input of the arrangement.

2. The arrangement of claim 1, wherein the first capacitor element and the second capacitor element comprise unipolar transistors having gate terminals that form the main terminals, and having source and drain terminals that form the auxiliary terminals and are connected to one another and to the reference node.

3. The arrangement of claim 2, wherein the transistors comprise n-channel metal oxide semiconductor transistors.

4. The arrangement of claim 1, further comprising a capacitor connected between the reference node and the reference potential terminal of the arrangement.

5. The arrangement of claim 1, wherein the arrangement is constructed using integrated circuit technology.

6. A method for connecting and disconnecting a capacitor to and from a circuit, respectively, comprising:
   providing a first and a second capacitor element comprising a controllable channel having a conductivity that is a function of a potential difference present between main terminals and auxiliary terminals thereof;
   applying a control signal to the auxiliary signals to vary the potential difference;
   tapping a capacitance between the two main terminals, wherein a value of the capacitance is a function of the control signals;
   inverting the control signal before it is applied to the auxiliary terminals; and
   providing a low-impedance connection between the controllable channels and a reference potential terminal when the control signal is at a level which generates low-impedance controllable channels.

7. A variable capacitor, comprising:
   two transistors coupled together in parallel, wherein gate terminals of the transistors form terminals of the capacitor, and wherein the source/drains of the two transistor are all connected together to form a reference node; and
   a control circuit configured to vary a potential at the reference node between a supply potential and a reference potential, thereby varying a capacitance associated with the two transistors;
   wherein the control circuit further comprises:
      a driver transistor coupled between the reference node and the reference potential, and having a control terminal coupled to a control signal input; and
      an inverter circuit having an input coupled to the control signal input, and an output coupled to the reference node,
      wherein the inverter circuit and driver transistor are operable, in concert, to pull the reference node down to the reference potential based on a state of a control signal at the control signal input.

8. The variable capacitor of claim 7, the control circuit further comprising a capacitor coupled in parallel with the driver transistor, wherein the capacitor is operable to act like a short circuit at high frequencies, thereby ensuring that at high frequencies the reference node is at the reference potential.

9. The variable capacitor of claim 7, wherein the control circuit further comprises:
a diode coupled between the supply potential and the inverter circuit; and
a backup capacitor coupled to the inverter circuit, and configured to be selectively charged to the supply potential,
wherein the diode is configured to supply the supply potential to the reference node based on a state of the inverter circuit, and
wherein the diode and backup capacitor operate as a low pass filter to reduce noise at the reference node when the supply potential is provided thereto.

10. A capacitor arrangement that is operable to be connected to and disconnected from a circuit, comprising:
a first capacitor element having a main terminal and an auxiliary terminal;
a second capacitor element having a main terminal and an auxiliary terminal;
wherein the first and second capacitor elements each have one control electrode connected to its respective main terminal, and each have a channel with a controllable conductivity connected to the auxiliary terminal;
wherein the auxiliary terminals of the first and second capacitor elements are connected to one another at a reference node;
wherein the main terminal of the first capacitor element and the main terminal of the second capacitor element form terminals of the capacitor;
wherein a control input is coupled to the reference node, and based upon a state thereof is operable to alter a capacitance of the capacitor, thereby selectively connecting or disconnecting the capacitor to or from the circuit, respectively;
an inverter configured to couple the control input to the reference node; and
wherein the inverter comprises a supply terminal and a backup capacitor connected thereto.

11. The arrangement of claim 10, further comprising a diode connected between a supply potential terminal of the arrangement and the supply terminal of the inverter.

12. The arrangement of claim 11, further comprising a switch connected in parallel with the diode and configured to selectively charge the backup capacitor.

13. A method for connecting and disconnecting a capacitor to and from a circuit, respectively, comprising:
providing a first and a second capacitor element comprising a controllable channel having a conductivity that is a function of a potential difference present between main terminals and auxiliary terminals thereof;
applying a control signal to the auxiliary signals to vary the potential difference;
tapping a capacitance between the two main terminals, wherein a value of the capacitance is a function of the control signal; and
further comprising at least one of:
providing capacitive stabilization of a potential applied to the auxiliary terminals; or providing capacitive backup of a supply potential of an inverter operable to invert the control signal.

14. The method of claim 13, wherein providing capacitive backup comprises recharging a backup capacitor from a supply voltage via a diode.

* * * * *